(12) United States Patent
Yi et al.

(10) Patent No.: US 12,250,481 B2
(45) Date of Patent: Mar. 11, 2025

(54) IMAGE SENSOR WITH STACKED CCD AND CMOS ARCHITECTURE

(71) Applicant: Fairchild Imaging, Inc., San Jose, CA (US)

(72) Inventors: Xianmin Yi, Menlo Park, CA (US); Alexander Lu, San Jose, CA (US)

(73) Assignee: FAIRCHILD IMAGING, INC., Wilmington, DE (US)

( * ) Notice: Subject to any disclaimer, the term of this patent is extended or adjusted under 35 U.S.C. 154(b) by 25 days.

(21) Appl. No.: 18/106,581

(22) Filed: Feb. 7, 2023

(65) Prior Publication Data

US 2024/0267652 A1 Aug. 8, 2024

(51) Int. Cl.
*H04N 25/75* (2023.01)
*H01L 27/146* (2006.01)
*H04N 25/778* (2023.01)
*H04N 25/78* (2023.01)

(52) U.S. Cl.
CPC ....... *H04N 25/75* (2023.01); *H01L 27/14636* (2013.01); *H01L 27/14643* (2013.01); *H04N 25/778* (2023.01); *H04N 25/78* (2023.01)

(58) Field of Classification Search
CPC ...... H04N 25/75; H04N 25/778; H04N 25/78; H01L 27/14636; H01L 27/14643
See application file for complete search history.

(56) References Cited

U.S. PATENT DOCUMENTS

| | | | |
|---|---|---|---|
| 5,289,022 A | 2/1994 | Iizuka et al. | |
| 5,414,467 A | 5/1995 | Komatsu | |
| 7,796,174 B1 * | 9/2010 | Harwit | H01L 27/14806 348/311 |
| 2006/0134807 A1 | 6/2006 | Henmi et al. | |
| 2008/0079032 A1 * | 4/2008 | Swain | H01L 27/14683 257/E27.162 |

(Continued)

OTHER PUBLICATIONS

Venezia, et al., "1.5μm Dual Conversion Gain, Backside Illuminated Image Sensor Using Stacked Pixel Level Connections with 13ke—Full-Well Capacitance and 0.8e—Noise," IEEE, 2018. pp. 10.1.1-10.1.4.

(Continued)

*Primary Examiner* — Ahmed A Berhan
(74) *Attorney, Agent, or Firm* — Panitch Schwarze Belisario & Nadel LLP

(57) ABSTRACT

Image sensor systems are disclosed that include charge coupled device (CCD) pixels integrated with CMOS readout circuitry via separately bonded substrates. According to some embodiments, columns of image sensing pixels on a first substrate are arranged with overlapping gate structures to facilitate charge transfer between the pixels. At least one pixel is coupled to a first conductive pad that contacts (or is melded with) a second conductive pad from a second substrate bonded to the first substrate. The second substrate includes a readout circuit using one or more CMOS devices coupled to the second conductive pad to receive the accumulated charge from a given column of pixels. The resulting photodetector signal from the accumulated charge can be, for instance, amplified via a source follower component and ultimately read out to a column amplifier, and subjected to further processing and/or use in a given downstream system.

16 Claims, 11 Drawing Sheets

(56) References Cited

U.S. PATENT DOCUMENTS

2019/0131328 A1    5/2019   Kim et al.
2019/0253652 A1    8/2019   Chuang et al.

OTHER PUBLICATIONS

"Fairchild Imaging CCD 5023," BAE Systems Imaging Solutions, 2012. 19 pages.
Lee, et al., "Charge-Coupled Cmos TDI Imager," Teledyne DALSA Inc. pp. 121-124.
Bebek, et al., "Development of Fully Depleted, Back-Illuminated Charge Coupled Devices," SPIE USE, V. 75499-10, Jun. 2, 2004. 11 pages.
International Search Report, PCT/US24/14414, mailed May 15, 2024, 12 pages.

\* cited by examiner

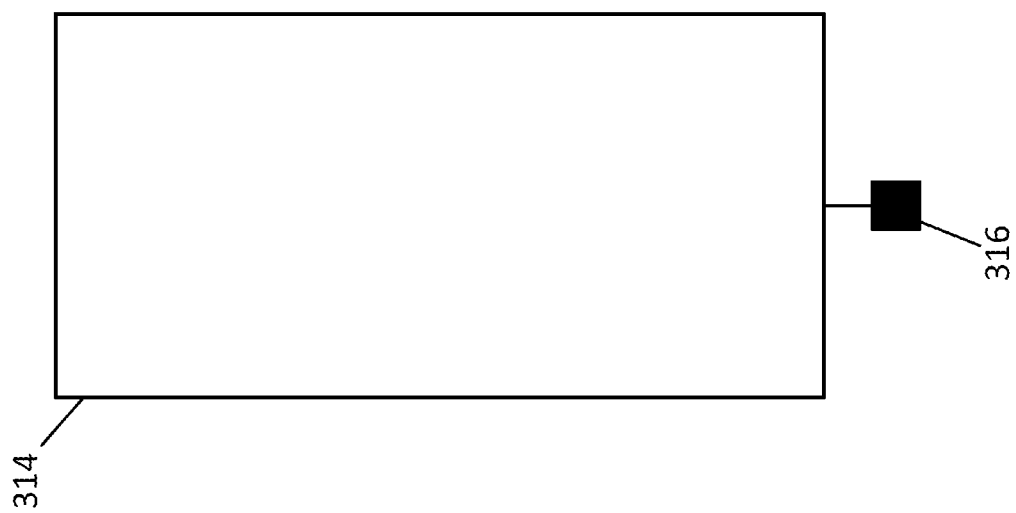
FIG. 3B

IMAGE SENSOR WITH STACKED CCD AND CMOS ARCHITECTURE

BACKGROUND

Image sensors are widely used for a number of different applications across a large portion of the electromagnetic spectrum. Many image sensor designs use an array of sensors to capture light across a given area upon which light impinges. Each sensor may be considered a single pixel of the sensor array, with the pixels arranged in any number of rows and columns. Each pixel includes some form of photodetector, and the image sensor includes at least one circuit to collect the charge from the photodetectors in response to an impinging light input. A number of non-trivial issues exist with regard to the design of the pixel array to provide improved performance.

BRIEF DESCRIPTION OF THE DRAWINGS

FIG. 3B is a diagram of a second substrate having one or more CMOS readout circuits, in accordance with an embodiment of the present disclosure.

Figure 1:
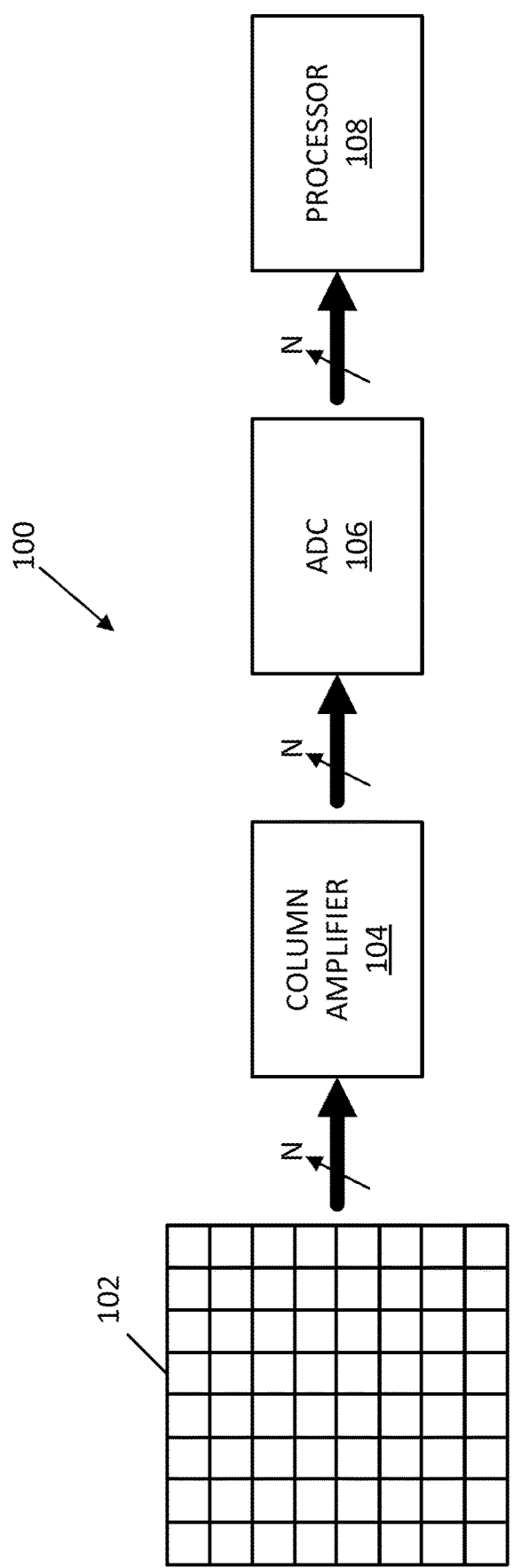
FIG. 1 is a block diagram of an image sensor system that uses a pixel array, in accordance with an embodiment of the present disclosure.

These and other features of the present embodiments will be understood better by reading the following detailed description, taken together with the figures herein described.

DETAILED DESCRIPTION

Image sensor systems are disclosed that include charge coupled device (CCD) pixels integrated with complementary metal oxide semiconductor (CMOS) readout circuitry via separately bonded substrates. According to some embodiments, columns of image sensing pixels on a first substrate are arranged with overlapping gate structures to facilitate charge transfer between the pixels. At least one pixel is coupled to a first conductive pad that contacts (or is melded with) a second conductive pad from a second substrate bonded to the first substrate. The second substrate includes a readout circuit using one or more CMOS devices coupled to the second conductive pad to receive the accumulated charge from a given column of pixels. The resulting photodetector signal from the accumulated charge can be, for instance, amplified via a source follower component and ultimately read out to a column amplifier, and subjected to further processing and/or use in a given downstream system. The integration of CCD pixels with CMOS readout circuitry yields superior performance compared to existing image sensor architectures.

General Overview

As previously noted, there a number of non-trivial issues that remain with respect to designing pixel arrays for an image sensor. For example, accumulating charge between pixels can be helpful to track either moving objects or a moving camera. However, high read noise can result from attempting to read out this charge in the analog domain. Digital reads can be made faster and with less noise, but integration with charge coupled devices (CCD) can be difficult when using the same substrate.

Thus, and in accordance with an embodiment of the present disclosure, techniques are disclosed for designing a sensor array on a first substrate having groups of pixels that transfer charge in a serial fashion across the pixels of a given group (e.g., column), and a corresponding digital readout circuit on a second substrate to read out the accumulated charge from the given group. Such a sensor array may be used to implement time-delay integration for tracking moving objects. The sensor array of pixels may be, for example, any type of charge coupled device (CCD) designed to receive light for the purpose of generating an image from the light received across the sensor array, although other pixel-based imaging arrays may also benefit. According to some embodiments, a group of pixels may be coupled together in a series arrangement with gates of adjacent pixels overlapping one another to facilitate easier charge transfer between adjacent pixels. In this way, charge may be continuously transferred from one pixel to the next in a chain (e.g., along a given pixel column) until the total accumulated charge from the group is read out from a final pixel in the chain. Any number of pixels may be used within the group (e.g., 2 or more pixels per group).

According to some embodiments, a second substrate is used for forming CMOS devices to provide a readout circuit that is coupled to one of the pixels in the group. The second substrate may be bonded to the first substrate or otherwise coupled in some fashion to the first substrate to provide a conductive path for the accumulated charge from the pixels to reach the readout circuit on the second substrate. In one example, conductive pads from the first and second substrates and brought into contact and may be fused together to form a single conductive structure to provide a path for charge transfer between the substrates. According to some embodiments, the readout circuit may include a transfer gate to pass the accumulated charge to a sensing node. The accumulated charge from the group of pixels may be used to generate a current signal that is ultimately fed to a column amplifier or other amplifier element before being converted into a digital signal via an analog-to-digital converter (ADC). Some embodiments may include filtering of the sensor signals and/or resulting current signal, prior to or after amplification.

The stacked configuration of CMOS readout circuitry over CCD image sensing pixels with overlapping gates provides a highly efficient sensor. For example, the disclosed configuration has fast line rates with low readout noise due to the use of parallel CMOS readout circuitry, and also has low dark current due to the efficient charge transfer between the image sensing pixels of the pixel array.

According to an example embodiment, an image sensor includes an array of image sensing pixels on a first substrate, a conductive structure coupled to a given pixel of the array of image sensing pixels, and a readout circuit coupled to the conductive structure. Each image sensing pixel comprises a gate structure over a semiconductor layer, and the gate structures of adjacent image sensing pixels partially overlap. The readout circuit comprises one or more CMOS devices on a second substrate different from the first substrate.

According to another example embodiment, an image sensor includes a pixel array on a first substrate and having at least one column of pixels. The at least one column of pixels includes at least a first pixel having a first gate structure over a semiconductor layer and a second pixel having a second gate structure over the semiconductor layer with the first gate structure partially overlapping with the second gate structure. The image sensor further includes a conductive structure coupled to at least one pixel of the column of pixels, a readout circuit coupled to the conductive structure and on a second substrate different from the first substrate, a column amplifier coupled to the readout circuit, an analog-to-digital converter (ADC) coupled to the column amplifier, and a processor coupled to the ADC.

According to another example embodiment, an image sensor includes a first substrate having an array of image sensing pixels, a second substrate having a readout circuit that comprises one or more CMOS devices, and a conductive structure that contacts at least a portion of the first substrate and at least a portion of the second substrate. The array of image sensing pixels comprises a first pixel having a first gate structure and an adjacent second pixel having a second gate structure with the first gate structure partially overlapping with the second gate structure. The conductive contact is coupled to an image sensing pixel of the array of image sensing pixels and is coupled to the readout circuit.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

System Architecture

FIG. 1 is a block diagram of an example image sensor 100, according to some embodiments. In some such example embodiments, image sensor 100 may represent or be an integral part of a charge coupled device (CCD) camera or other type of imaging device. In some embodiments, image sensor 100 may be configured for capturing different portions of the electromagnetic spectrum, such as visible light, ultraviolet radiation, infrared radiation, or x-rays, to name a few examples. Image sensor 100 may include a pixel array 102, a column amplifier 106, an ADC 108, and a processor 110. Each of the illustrated components may be included together on a same printed circuit board (PCB) or together in a single chip package (e.g., a system-in-package or system-on-chip). In some other embodiments, any one or more of the elements may be provided in a separate chip package and/or on separate PCBs. According to some embodiments, pixel array 102 is integrated with or otherwise includes a readout circuit. In one such example case, pixel array 102 is provided on a separate substrate from CMOS devices used as a readout circuit for pixel array 102. In some such cases, pixel array 102 may be provided on a first substrate while CMOS devices of the readout circuit are provided on a second substrate bonded to the first substrate.

According to some embodiments, pixel array 102 includes a plurality of pixels arranged in a row-column format. Each pixel of pixel array 102 may have a similar architecture that includes at least a photodetector. The photo detection area of each pixel on which incident radiation may impinge may vary from one embodiment to the next, but in some example cases has a physical size of around 1 μm×1 μm up to around 5 μm×5 μm. In some embodiments, the photo detection area may include a conductive layer and a gate layer separated from the conductive layer by a gap that can be filled with a dielectric material (e.g., silicon dioxide). Each of the conductive layer and gate layer of a given pixel can include a semiconductor material, such as silicon, polysilicon, silicon germanium, or gallium arsenide. Likewise, the shape and lensing (if present) of the photo detection area can also vary from one example to the next, depending on factors such as desired fill factor of the array. According to some embodiments, each row of pixels may be coupled together via a common row-select line (e.g., a wordline), to provide separately addressable rows of pixels.

According to some embodiments, the gates of adjacent pixels in the same column (or same row) partially overlap with one another in the z-direction (e.g., normal to the surface of the substrate). This overlap can facilitate more efficient charge transfer between pixels. According to some embodiments, the overlap gap may be filled with a dielectric material, such as silicon dioxide. The overlap gap between adjacent gates may have a thickness between about 10 nm and about 100 nm.

According to some embodiments, the outputs from N different columns of pixels (with each column having any number of pixel groups) are received by column amplifier 104. According to some embodiments, column amplifier 104 represents N separate column amplifiers with a given column amplifier configured to receive the output from a corresponding column of pixels from pixel array 102. In this way, a given row of pixels from pixel array 102 (or given groups of pixels) can be selected via a row-select line and simultaneously read out via the N column amplifiers 104. According to some embodiments, column amplifier 104 may include any type of amplifier configuration, such as any number of source follower FETs or operational amplifiers. In some embodiments, a single column amplifier 104 may be used in conjunction with a multiplexer to receive each of the N column outputs from pixel array 102.

According to some embodiments, the output(s) from column amplifier 104 is/are received by ADC 106. As noted above, ADC 106 may represent N different ADCs with a given ADC configured to receive the output from a corresponding column amplifier 104. ADC 106 may be implemented with any suitable ADC technology.

Processor 108 may be configured to receive the digitized signal from ADC 106 (or N digitized signals across N ADCs) and perform any number of operations with the signal(s). For example, processor 108 may receive the signal data from a given row of pixels of pixel array 102 and use the signal data to create an image or a portion of an image captured via pixel array 102. As used herein, the term "processor" may refer to any device or portion of a device that processes electronic data from registers and/or memory to transform that electronic data into other electronic data that may be stored in registers and/or memory. Processor 108 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, custom-built semiconductor, or any other suitable processing devices.

Grouped Pixel Design

Figure 2:
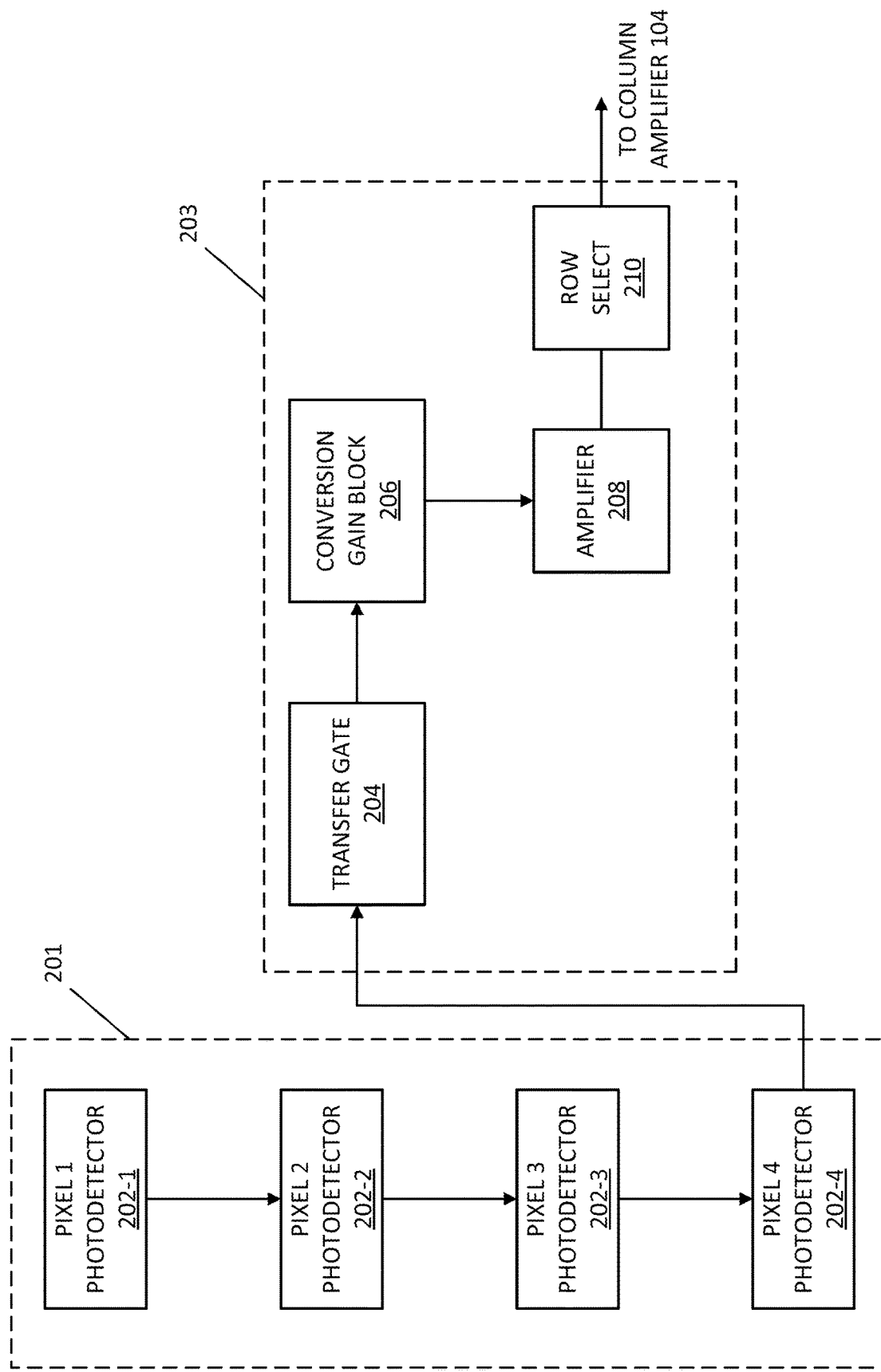
FIG. 2 is a block diagram illustrating the various components of a group of pixels of the pixel array of FIG. 1 and of a readout circuit, in accordance with an embodiment of the present disclosure.

FIG. 2 illustrates a block diagram of a group of pixels 201 from pixel array 102 that includes four pixels coupled in series and a final charge output from one of the pixels to a readout circuit 203, according to some embodiments. As noted above, four pixels are used here as an example, but any number of pixels may be grouped together (e.g., along a column) in the same fashion to form a chain of charge transfer from one pixel to the next. Each of the four pixels includes a photodetector 202-1-202-4. Photodetector 202-1-202-4 may include any type of photosensitive design, such as the architecture described above that uses semiconductor gate layers over a semiconductor base layer. As described above, the active area of a given photodetector (e.g., the area which is sensitive to impinging light and generates a corresponding signal based on intensity of that light), as well as any lensing, can vary depending on the given application. Further details regarding the photodetector structures of the pixels are provided with reference to FIG. 5. According to some embodiments, pixel array 102 is provided on a first substrate while readout circuit 203 is provided on a different second substrate that may be bonded to the first substrate (e.g., via flip-chip bonding).

According to some embodiments, the charge generated at each of the four pixels may be transferred along from one pixel to the next until the accumulated charge at the last pixel (e.g., photodetector 202-4) is passed on to readout circuit 203. The charge transfer may occur by sequentially applying voltage to the gates of the pixels at different times to push the charge from one pixel to the next. In general, charge is held at a first pixel while voltage is applied to the gate of the first pixel and is then released onto an adjacent second pixel when voltage is removed from the first pixel and instead applied to the second pixel. This process may be repeated to move the charge down a line of adjacent pixels.

According to some embodiments, readout circuit 203 includes a transfer gate 204 coupled to an output of the last pixel in the group 201 (e.g., to photodetector 202-4). The last pixel of the group 201 may be defined as the pixel that receives transferred charge from each other pixel of the group 201. Transfer gate 204 acts like a gatekeeper to the accumulated charge generated by photodetectors 202-1-202-4 in response to a light input. In some embodiments, transfer gate 204 may include a single field effect transistor (FET), such as a p-doped or n-doped metal oxide semiconductor device (PMOS or NMOS). In some embodiments, transfer gate 204 is omitted from readout circuit 203 such that the output of the last pixel of group 201 is coupled directly to a conversion gain block 206.

The accumulated charge is passed on to conversion gain block 206, where the charge is stored across at least one capacitor, according to some embodiments. In some examples, conversion gain block 206 may include one or more switches and any number of capacitors, where a state of the switches can be used to select a conversion gain mode in which the conversion gain block 206 operates. In such examples, the charge that is received by conversion gain block 206 may be stored at a given conversion gain based on which capacitors have been coupled to a sensing node within conversion gain block 206. According to some embodiments, the at least one capacitor of conversion gain block 206 may be provided by any suitable conductive structure.

According to some embodiments, the sensing node from conversion gain block 206 is further coupled to amplifier 208 to generate an output signal. Amplifier 208 may be implemented, for example, as a single source-follower NMOS or PMOS device, or as an operational amplifier.

According to some embodiments, a row select switch 210 is included within readout circuit 203. Row select switch 210 may have a gate or select input that is coupled to a common row-line (e.g., a wordline) with other pixels (e.g., all other pixels used to readout from respective pixel groups) of the same row. Accordingly, when the current row is activated to read out from, row select switch 210 is activated and turned on to read out the output signal to column amplifier 104. When the current row is not selected, row select switch 210 is not active and no signal is read out to column amplifier 104. Row select switch 210 may be implemented, for example, as an NMOS or PMOS device with the row-line coupled to the gate of the NMOS or PMOS device.

Figure 3A:
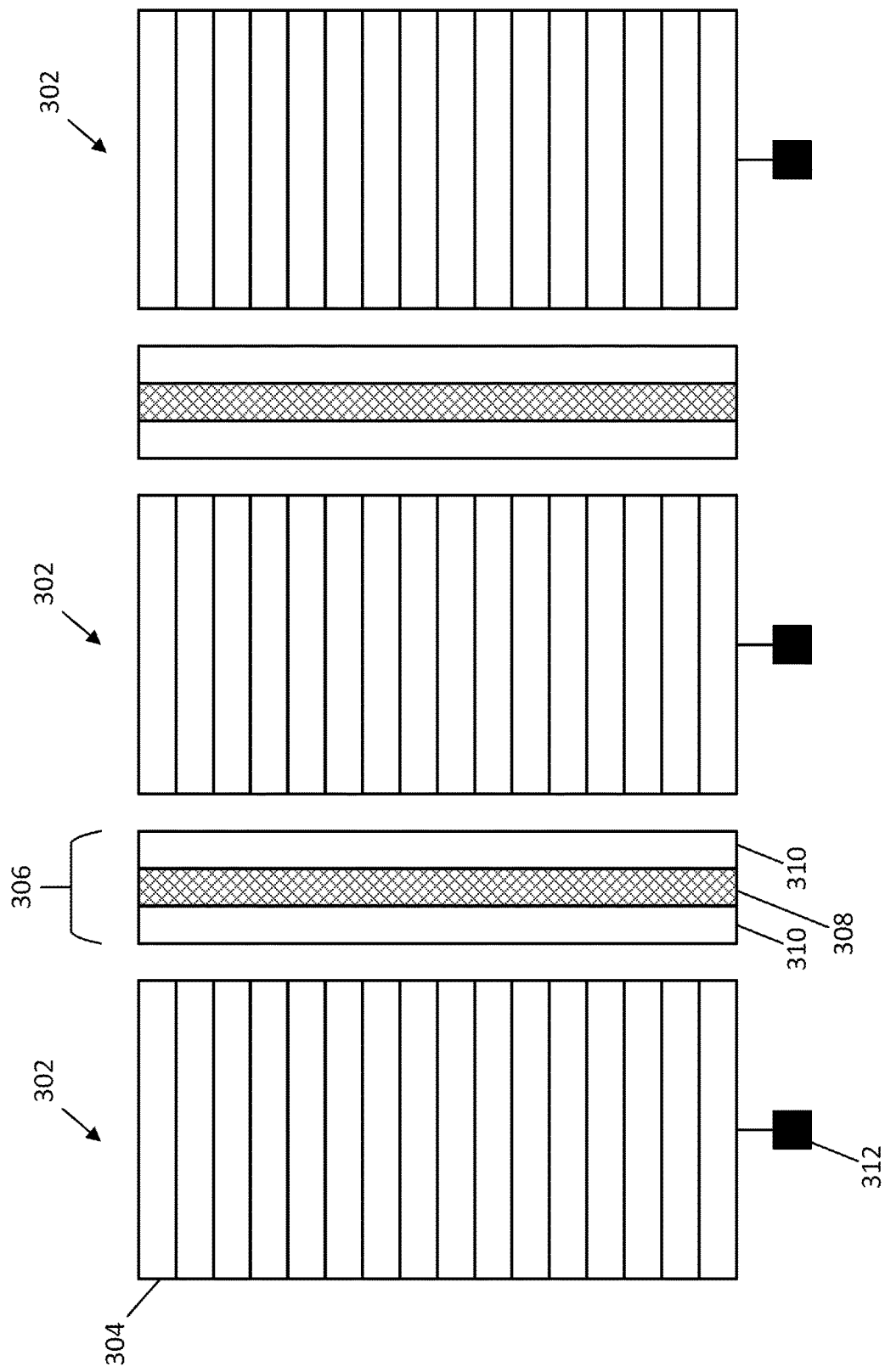
FIG. 3A is a diagram of a first substrate having an array of image sensing pixels, in accordance with an embodiment of the present disclosure.

FIG. 3A illustrates a top-down diagram of a first substrate having a plurality of imaging sensing pixel columns 302, according to some embodiments. Each image sensing pixel column 302 can include any number of individual pixels 304. According to some embodiments, pixels 304 of a given pixel column 302 are arranged in series to transfer charge sequentially from one pixel to the next along a given pixel column 302. Each pixel 304 may be defined by a given area on the first substrate that includes a gate over a conductive layer with a gap between the gate and conductive layer (such as an airgap) or a dielectric layer between the gate and conductive layer. As noted above, each pixel 304 may have a physical size of around 1 μm×1 μm up to around 5 μm×5 μm.

According to some embodiments, one or more reset gates 306 may be provided between pixel columns 302 on the first substrate. Reset gates 306 may be used to provide anti-blooming capability to avoid light saturation at any of pixels 304 of a given adjacent pixel column 302 by applying a reset voltage to any of pixels 304. The reset voltage may be applied to a drain (or source) connection 308 of one or more reset gates 306 and the voltage may be passed on to any of pixels 304 of adjacent pixel columns 302 by switching on reset gates 310.

According to some embodiments, one of the pixels of a given pixel column 302 (e.g., a last pixel in the column) has its gate coupled to a first conductive pad 312 on a surface of the first substrate. First conductive pad 312 may include any suitable conductive material, such as copper, aluminum, titanium, gold, tin, tungsten, or any alloy thereof. First conductive pad 312 may be any shape, such as a circle with a diameter less than about 1 μm or less than about 0.5 μm. In general, first conductive pad 312 may have a cross-sectional area that is less than about 1 μm². According to some embodiments, first conductive pad 312 contacts or otherwise bonds with a second conductive pad present on a second substrate to provide a conductive pathway between the first and second substrates.

FIG. 3B illustrates a top-down diagram of a second substrate that includes a plurality of readout circuits 314, according to some embodiments. Each readout circuit 314 may include any number of CMOS devices to convert the charge collected from a given pixel column 302 into a photocurrent that is ultimately sent on to, for example, a column amplifier. According to some embodiments, each pixel column 302 from the first substrate is associated with a corresponding readout circuit 314 on the second substrate.

According to some embodiments, each readout circuit 314 receives the accumulated charge at an input that is coupled to a second conductive pad 316. In some embodiments, second conductive pad 316 has substantially the same properties and shape as first conductive pad 312. As noted above, each first conductive pad 314 on the first substrate may align with and contact or otherwise bond with a corresponding second conductive pad 316 on the second substrate to allow for charge transfer between pixel columns 302 and their corresponding readout circuits 314.

Figure 4:
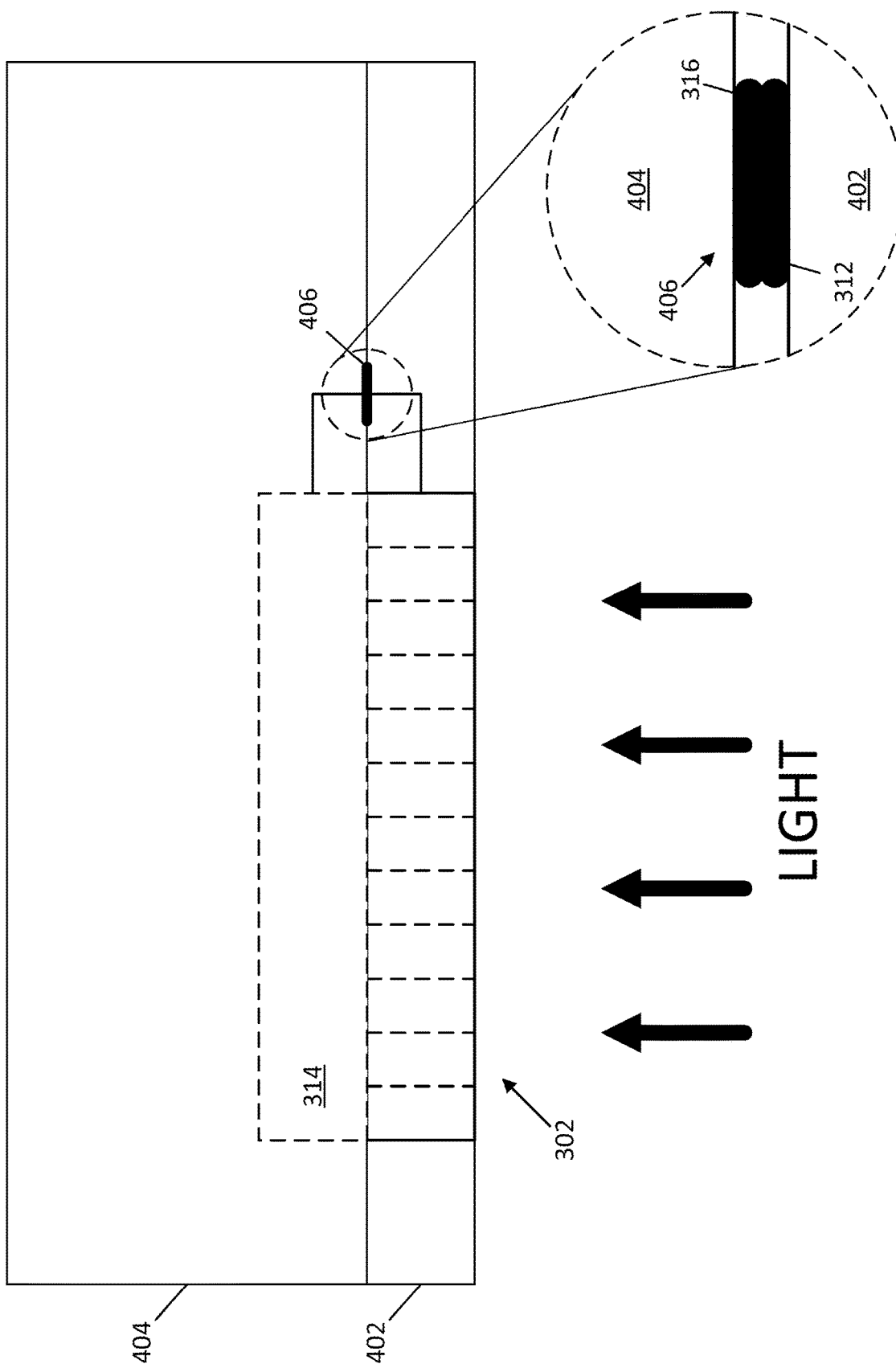
FIG. 4 is a diagram illustrating a coupling between the first and second substrates having the pixel array and the CMOS readout circuits, in accordance with an embodiment of the present disclosure.

FIG. 4 illustrates a side view of an example image sensor that includes a first substrate 402 having a pixel array with at least one pixel column 302 and a second substrate 404 having at least one readout circuit, such as readout circuit 314, according to some embodiments. Light impinges upon the pixel array on first substrate 402. Each of first substrate 402 and second substrate 404 may be semiconductor substrates, such as silicon-based substrates. Second substrate 404 may be substantially thicker than first substrate 402. For example, first substrate 402 may be less than 5 μm thick while second substrate 404 may be several hundreds of micrometers thick. Second substrate 404 may include any number of other CMOS circuits beyond the readout circuits while first substrate 402 does not include any CMOS devices, according to some embodiments.

As discussed above, a conductive pathway may be formed between pixel column 302 and readout circuit 314 across the two substrates via a conductive structure 406. According to some embodiments, and as shown in the blown-out portion, conductive structure 406 may be formed from the union between first conductive pad 312 on the surface of first substrate 402 and second conductive pad 316 on the surface of second substrate 404. First conductive pad 312 and second conductive pad 316 may be pressed together to form a strong Ohmic contact, or may be welded together via a eutectic bonding process to form a solid metallic structure that extends between the surfaces of first substrate 402 and second substrate 404. In some examples, first conductive pad 312 and second conductive pad 316 may be heated to cause the pad material to reflow, thereby forming an integral conductive pathway. In still other examples, first conductive pad 312 and second conductive pad 316 may be bonded together (e.g., conductive epoxy, solder), thereby forming the conductive pathway. More generally, the conductive pathway can be formed by any suitable forming process that can be used to form a conductive structure between a given pixel column 302 and readout circuit 314, including heat-based, vibration-based, and/or chemical-based forming processes.

Figure 5:
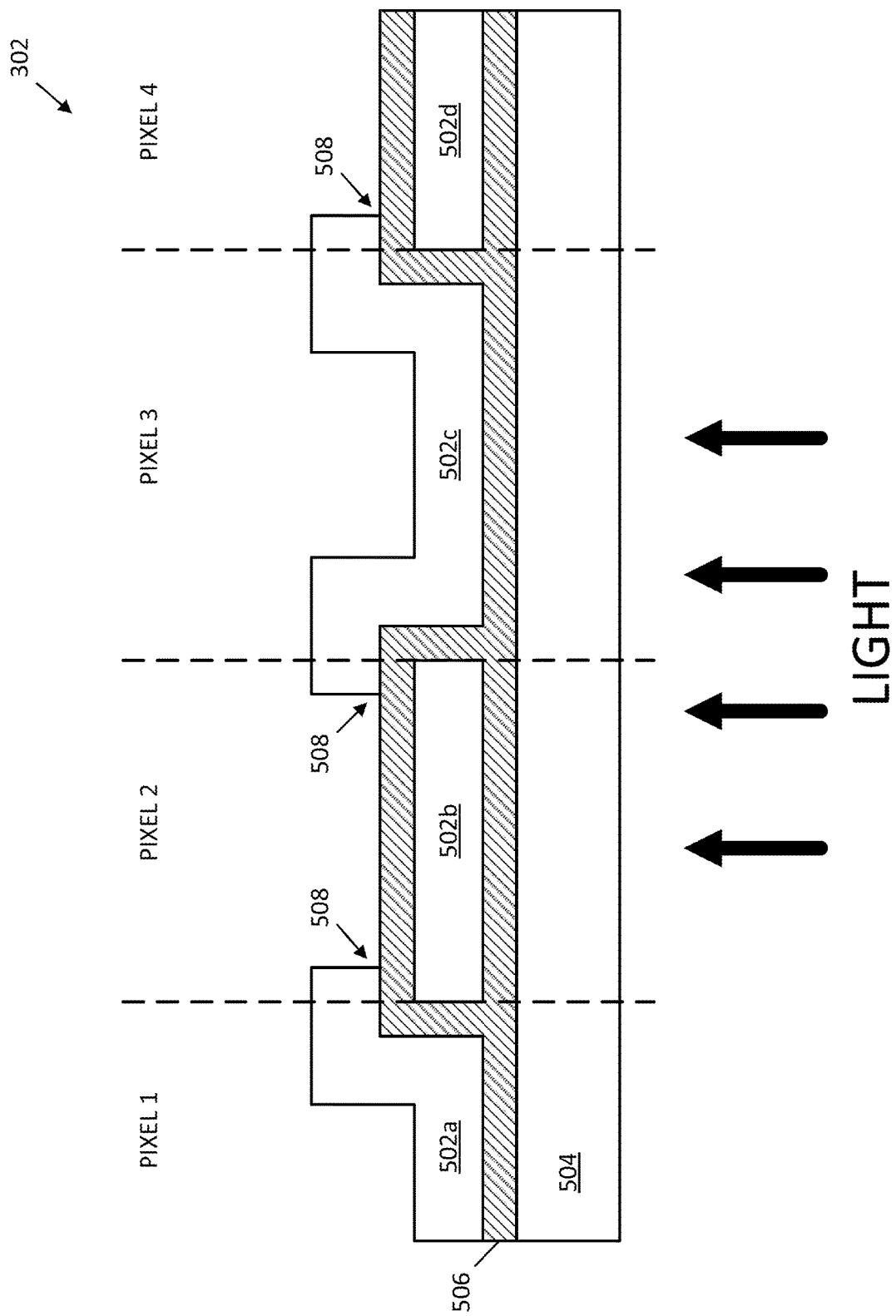
FIG. 5 is a cross-sectional diagram across a given column of image sensing pixels on the first substrate, in accordance with an embodiment of the present disclosure.

FIG. 5 illustrates a cross-section view through a given pixel column 302 showing four pixels, according to an embodiment. The four pixels each include a corresponding gate 502a-502d over a common semiconductor layer 504. The gates 502a-504d and semiconductor layer 504 may each include semiconductor material. For example, gates 502a-504d may each include polysilicon while semiconductor layer 504 includes epitaxially grown silicon. According to some embodiments, semiconductor layer 504 is a portion of first substrate 402 that remains following the removal of the rest of first substrate 402. Gates 502a-504d and semiconductor layer 504 may both be doped with the same dopant type, such as all doped with n-type dopants (e.g., phosphorous or arsenic). Light may be received through a backside of semiconductor layer 504.

According to some embodiments, a dielectric layer 506 is present between gates 502a-502d and semiconductor layer 504. Dielectric layer 506 may be any suitable dielectric material, such as silicon dioxide, silicon oxynitride, or silicon oxycarbide to name a few examples. In some examples, dielectric layer 506 has a thickness between about 10 nm and about 100 nm between gates 502a-502d and semiconductor layer 504. According to some embodiments, dielectric layer 506 may also wrap around alternating gates (such as around gates 502b and 502d in FIG. 5) to separate adjacent gates from one another.

According to some embodiments, adjacent gates of pixel column 302 partially overlap in the z-direction (e.g., normal to the surface of the substrate) at overlap areas 508. In some examples, each gate will partially overlap with each of its two neighboring gates at overlap areas 508. These overlap areas 508 may be provided to facilitate more efficient charge transfer between adjacent gates by reducing the dark current. According to some embodiments, dielectric layer 506 is present within the gaps at overlap areas 508 and may have a thickness within the overlap gaps between about 10 nm and about 100 nm. In some embodiments, a first dielectric layer is used between gates 502a-502d and semiconductor layer 504 and a second dielectric layer is used within the overlap gaps at overlap areas 508. The first and second dielectric layers may have the same material composition or different material compositions.

Figure 6:
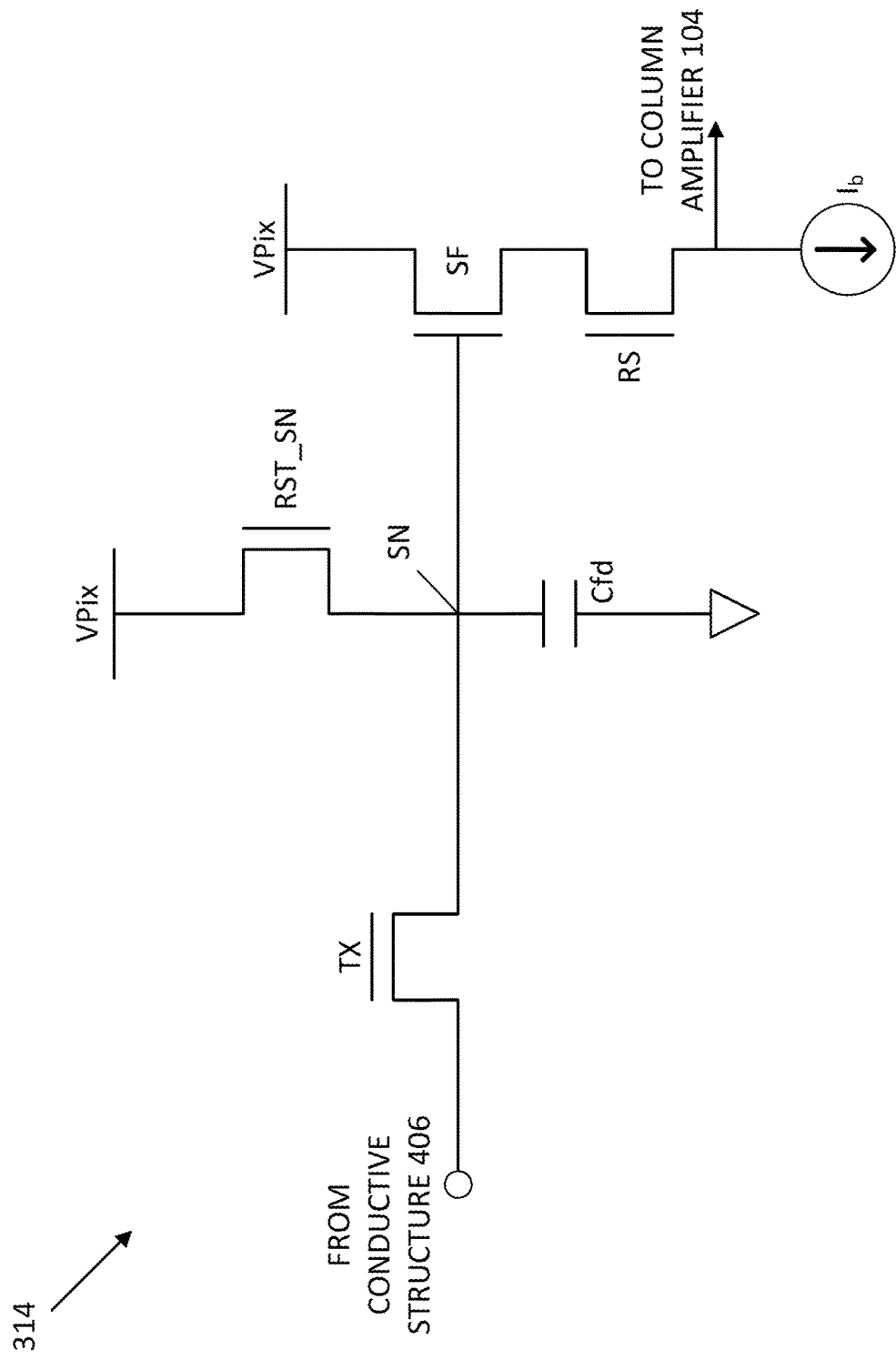
FIG. 6 is a schematic diagram of an example readout circuit, in accordance with an embodiment of the present disclosure.

FIG. 6 illustrates an example circuit schematic of readout circuit 314, according to an embodiment. The accumulated charge from a given pixel column 302 may be received by readout circuit 314 via conductive structure 406. In some embodiments, the charge is received by transfer gate TX, while in other embodiments the charge is received directly at sensing node SN (e.g., transfer gate TX is omitted). At a given moment in time, at least a portion of the accumulated charge is released onto sensing node SN via transfer gate TX by turning on transfer gate TX for a predefined number of clock cycles. Once the charge has been released to sensing node SN, it can be stored across capacitor Cfd (or across any number of capacitors). According to some embodiments, capacitor Cfd represents the parasitic capacitance present at conductive structure 406 and may be between about 1 femtofarad (fF) and about 2 fF. The conversion gain may be, for example, between about 170 μV/electron and about 200 μV/electron.

The stored accumulated charge potential activates the source follower amplifier SF to produce an output signal to send to column amplifier 104. Source follower amplifier SF may be a single FET device or any other amplifier structure, such as an operational amplifier. According to some embodiments, the pixel readout circuit includes a current source $I_b$ to provide a bias current for operating the source follower amplifier SF. Source follower amplifier SF may be powered, for example, via rail power VPix between about 2 V and about 2.5 V or other suitable rail voltage. The output signal produced from source follower amplifier SF can only be sent on to column amplifier 104 if the row select switch RS is biased on. According to some such examples, all pixel groups (e.g., pixel columns 302) in a given row of pixel array 102 will share a same row select line (e.g., a word line) that couples with the gate of row select switch RS. If row select switch RS is biased off, then the current pixel group is part of a row that is not currently being read from and no signal will be sent on to column amplifier 104 from the current pixel group.

According to some embodiments, the potential at sensing node SN can be reset to a baseline or reference value via a reset switch RST_SN. When reset switch RST_SN is biased on, the rail voltage VPix is applied to whichever nodes are coupled to the end of reset switch RST_SN (such as at least sensing node SN).

Example Image Sensor Fabrication

FIGS. 7A-7E include cross-sectional views that collectively illustrate an example process for forming an image sensor using two bonded substrates, in accordance with an embodiment of the present disclosure. Each figure shows an example structure that results from the process flow up to that point in time, so the depicted structure evolves as the process flow continues, culminating in the structure shown in FIG. 7E, which is similar to the structure shown in FIG. 4. The illustrated image sensor may be part of a larger integrated circuit that includes other integrated circuitry not depicted. Example materials and process parameters are given, but the present disclosure is not intended to be limited to any specific such materials or parameters, as will be appreciated.

Figure 7A:
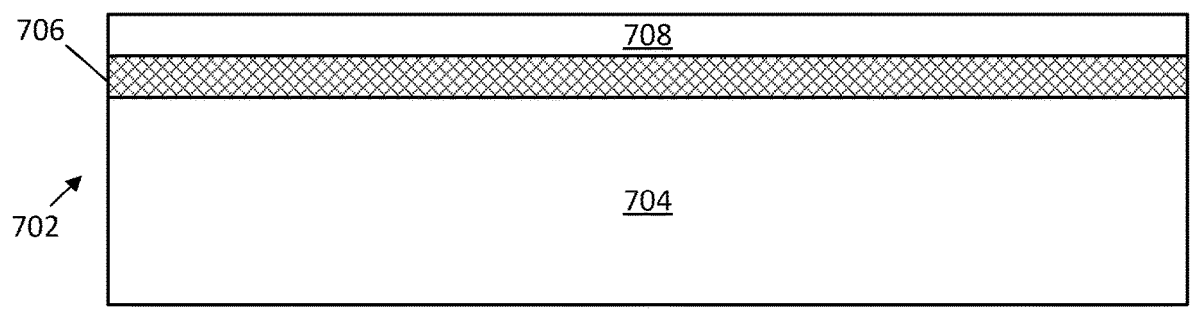
FIGS. 7A-7E are cross-sectional views that illustrate various stages in an example process for forming an image sensor, in accordance with some embodiments of the present disclosure.

FIG. 7A illustrates a cross-sectional view taken through a first substrate 702 having a bulk portion 704, a buried layer 706 on bulk portion 704, and a semiconductor layer 708 on buried layer 706, according to an embodiment. Substrate 702 may be a silicon-on-insulator (SOI) substrate with buried layer 706 representing the buried insulator layer. Bulk portion 704 may be substantially thicker than both buried layer 706 and semiconductor layer 708. In some embodiments, each of buried layer 706 and semiconductor layer 708 may have a thickness between 100 nm and 1000 nm, while bulk portion 704 may have a thickness on the order of several hundreds of micrometers. Bulk portion 704 and semiconductor layer 708 may each include silicon, germanium, gallium arsenide, indium phosphide, or any combination thereof. Buried layer 706 may include any suitable dielectric material, such as silicon dioxide, silicon oxynitride, or silicon oxycarbide. Semiconductor layer 708 may be epitaxially grown on buried layer 706.

Figure 7B:
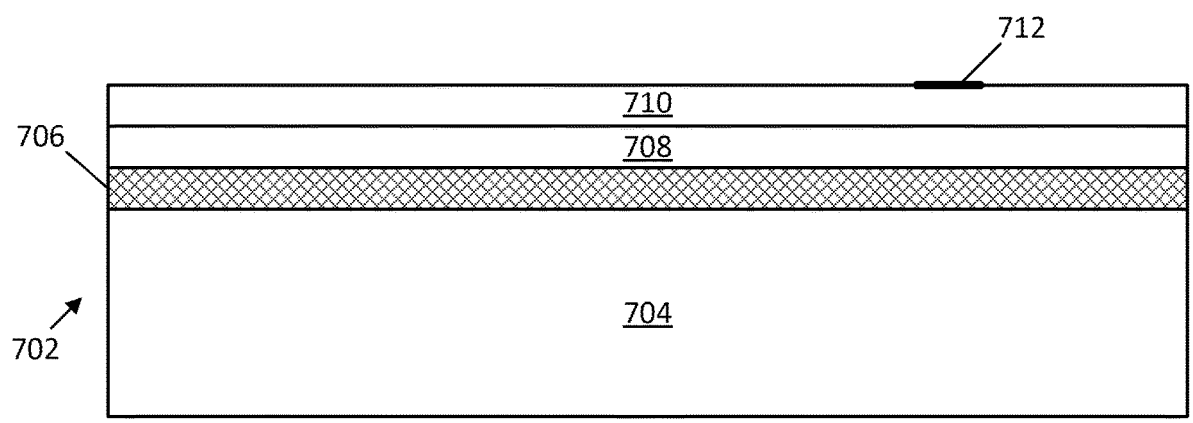

FIG. 7B depicts the cross-section view of the structure shown in FIG. 7A following the formation of a device layer 710 and a first conductive pad 712 on device layer 710, according to an embodiment. Device layer 710 may include gates and any number of dielectric layers to form a pixel array having pixel columns of pixels with overlapping gates, such as those shown in FIG. 5. The gates of device layer 710 may include polysilicon. First conductive pad 712 may be connected to a pixel of a given pixel column in device layer 710. In some examples, semiconductor layer 708 represents the common semiconductor layer 504 for each of the pixels.

Figure 7C:
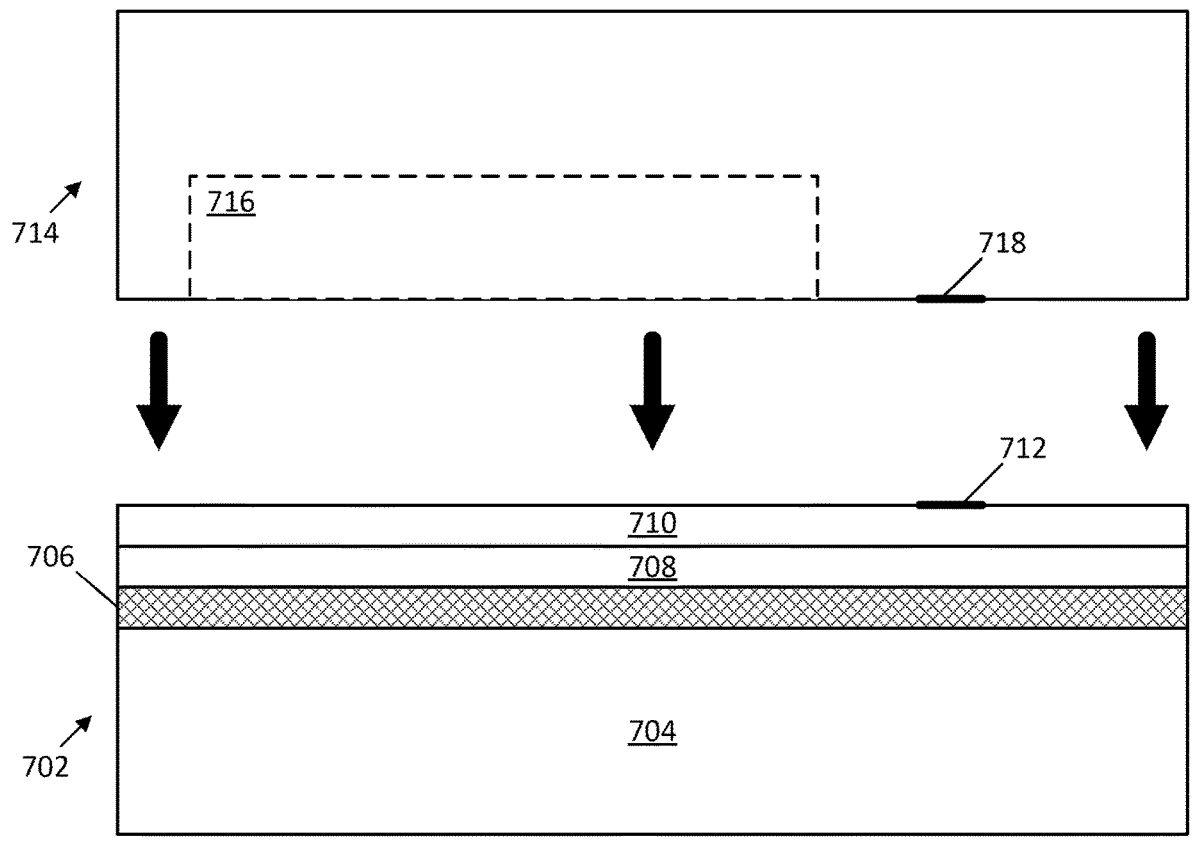

FIG. 7C depicts the cross-section view of the structure shown in FIG. 7B along with a second substrate 714 being brought into contact with first substrate 702, according to an embodiment. Second substrate 714 may include a silicon substrate, an SOI substrate, or any other suitable semiconductor substrate. Second substrate 714 may include one or more readout circuits 716 that each include any number of CMOS devices, and a second conductive pad 718. As discussed above, first and second conductive pads 712/718 may be substantially the same in material composition and geometry (e.g., round or square copper pads). According to some embodiments, at least first and second conductive pads 712/718 are aligned with one another when first substrate 702 and second substrate 714 are brought into contact. Although the arrows depict second substrate 714 being brought into contact with first substrate 702, in some other examples first substrate 702 is brought into contact with second substrate 714.

Figure 7D:
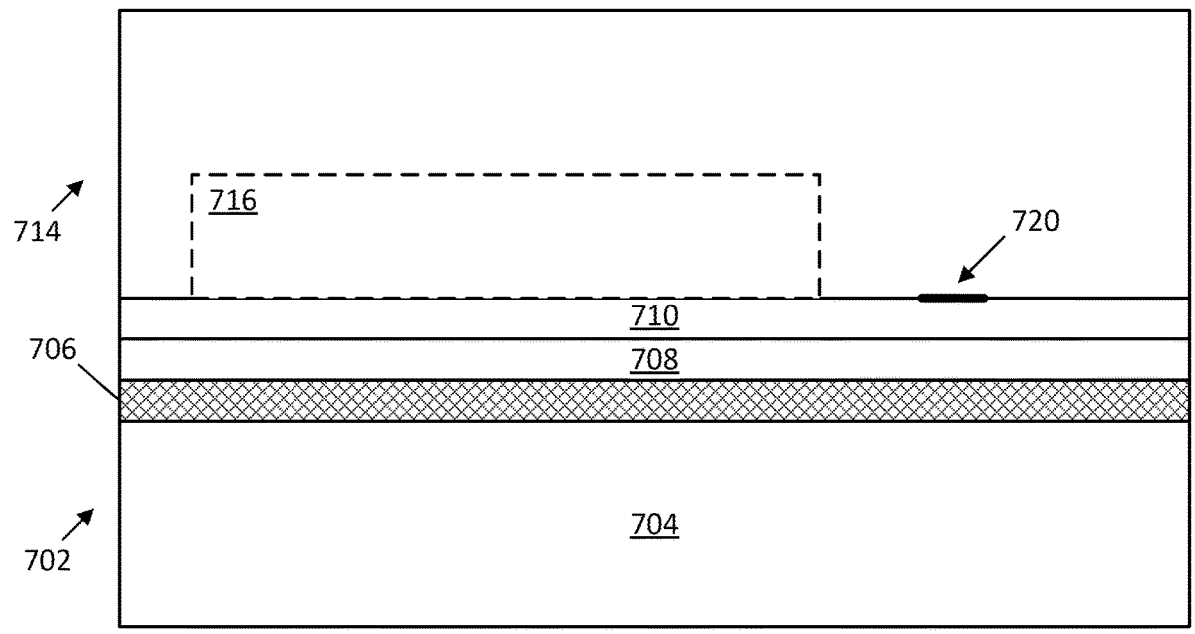

FIG. 7D depicts the cross-section view of the structure shown in FIG. 7C following a bonding of first substrate 702 to second substrate 714, according to an embodiment. The substrates may be bonded together using any standard bonding procedure, such as direct bonding, surface activating bonding, or eutectic bonding. In some embodiments, the bonding process squeezes first conductive pad 712 and second conductive pad 718 together to form conductive structure 720. In some embodiments, the bonding process causes the conductive pads to meld together to form a solid conductive structure 720. Accordingly, a seam may or may not be visible (e.g., via a scanning electron microscope (SEM) cross-section or a transmission electron microscope (TEM) cross-section) between first conductive pad 712 and second conductive pad 718 following the bonding process.

Figure 7E:
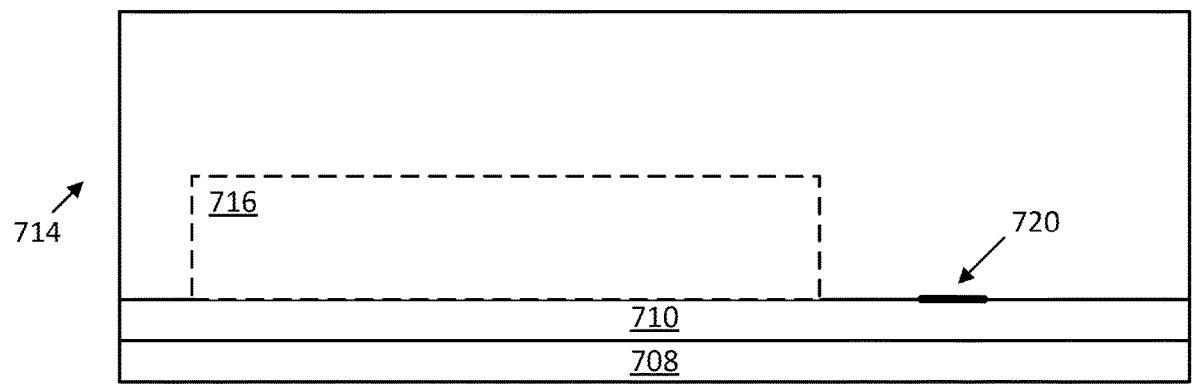

FIG. 7E depicts the cross-section view of the structure shown in FIG. 7D following the removal of bulk portion 704 of first substrate 702, according to an embodiment. Bulk portion 704 may be removed using any suitable technique, such as grinding it away via chemical mechanical polishing (CMP) or plasma etching. According to some embodiments, bulk portion 704 may be continually removed until the bottom surface of buried layer 706 is exposed. In some embodiments, buried layer 706 may remain beneath semiconductor layer 708 to protect semiconductor layer 708 if the light of interest can pass through buried layer 706 with negligible attenuation or diffraction. In other embodiments, buried layer 706 is also removed following the removal of bulk portion 704 to expose the bottom surface of semiconductor layer 708.

Example Computing Platform

Figure 8:
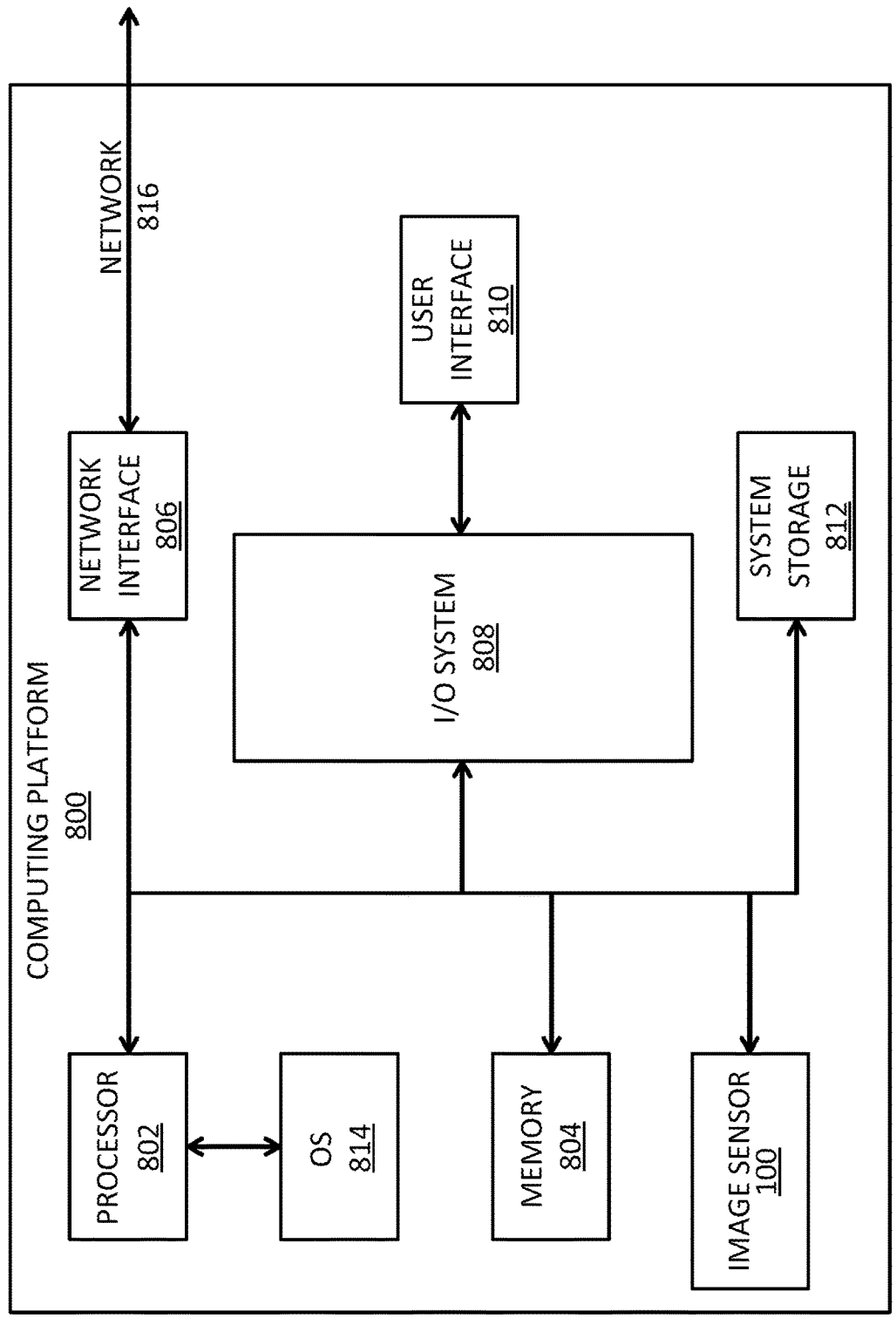
FIG. 8 illustrates an example computing platform that includes the image sensor of FIG. 1, in accordance with an embodiment of the present disclosure.

FIG. 8 illustrates an example computing platform 800 that includes or otherwise interfaces with image sensor 100, configured in accordance with certain embodiments of the present disclosure. In some embodiments, computing platform 800 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, computing platform 800 may comprise any combination of a processor 802, a memory 804, image sensor 100, a network interface 806, an input/output (I/O) system 808, a user interface 810, and a storage system 812. In some embodiments, one or more components of image sensor 100 are implemented as part of processor 802. As can be further seen, a bus and/or interconnect is also provided to allow for communication between the various components listed above and/or other components not shown. Computing platform 800 can be coupled to a network 816 through network interface 806 to allow for communications with other computing devices, platforms, or resources. Other componentry and functionality not reflected in the block diagram of FIG. 8 will be apparent in light of this disclosure, and it will be appreciated that other embodiments are not limited to any particular hardware configuration.

Processor 802 can be any suitable processor and may include one or more coprocessors or controllers to assist in control and processing operations associated with computing platform 800. In some embodiments, processor 802 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 804 can be implemented using any suitable type of digital storage including, for example, flash memory and/or random access memory (RAM). In some embodiments, memory 804 may include various layers of memory hierarchy and/or memory caches. Memory 804 may be implemented as a volatile memory device such as, but not limited to, a RAM, dynamic RAM (DRAM), or static RAM (SRAM) device. Storage system 812 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 812 may comprise technology to increase the storage performance enhanced protection for valuable digital media when multiple hard drives are included.

Processor 802 may be configured to execute an Operating System (OS) 814 which may comprise any suitable operating system, such as Google Android (Google Inc., Mountain View, CA), Microsoft Windows (Microsoft Corp., Redmond, WA), Apple OS X (Apple Inc., Cupertino, CA), Linux, or a real-time operating system (RTOS). As will be appreciated in light of this disclosure, the techniques provided herein can be implemented without regard to the particular operating system provided in conjunction with computing platform 800, and therefore may also be implemented using any suitable existing or subsequently-developed platform.

Network interface 806 can be any appropriate network chip or chipset which allows for wired and/or wireless connection between other components of computing platform 800 and/or network 816, thereby enabling computing platform 800 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 808 may be configured to interface between various I/O devices and other components of computing platform 800. I/O devices may include, but not be limited to, a user interface 810. User interface 810 may include devices (not shown) such as a display element, touchpad, keyboard, mouse, and speaker, etc. I/O system 808 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 802 or any chipset of computing platform 800. In some embodiments, an image captured via image sensor 100 can be displayed upon the display element of user interface 810.

It will be appreciated that in some embodiments, the various components of the computing platform 800 may be combined or integrated in a system-on-a-chip (SoC) architecture. In some embodiments, the components may be hardware components, firmware components, software components or any suitable combination of hardware, firmware or software.

In various embodiments, computing platform 800 may be implemented as a wireless system, a wired system, or a combination of both. When implemented as a wireless system, computing platform 800 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, computing platform 800 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, GPUs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Further Example Embodiments

The following examples pertain to further embodiments, from which numerous permutations and configurations will be apparent.

Example 1 is an image sensor that includes an array of image sensing pixels on a first substrate, a conductive structure coupled to a given pixel of the array of image sensing pixels, and a readout circuit coupled to the conductive structure. At least one image sensing pixel comprises a gate over the first substrate and an adjacent gate from an adjacent image sensing pixel partially overlaps with the gate of the at least one image sensing pixel. The readout circuit comprises one or more metal oxide semiconductor (MOS) devices on a second substrate different from the first substrate.

Example 2 includes the image sensor of Example 1, further comprising one or more reset gates coupled to at least one of the image sensing pixels.

Example 3 includes the image sensor of Example 2, wherein the one or more reset gates are on the first substrate.

Example 4 includes the image sensor of any one of Examples 1-3, wherein the conductive structure comprises a first conductive pad on the first substrate and a second conductive pad on the second substrate.

Example 5 includes the image sensor of any one of Examples 1-4, wherein the conductive structure has a cross-sectional area of less than 1 $\mu m^2$.

Example 6 includes the image sensor of any one of Examples 1-5, wherein the gate of each image sensing pixel and the semiconductor layer are doped with n-type dopants.

Example 7 includes the image sensor of any one of Examples 1-6, wherein an overlap gap between the gate of the at least one image sensing pixel and the adjacent gate of the adjacent image sensing pixel is between about 10 nm and about 100 nm.

Example 8 includes the image sensor of any one of Examples 1-7, further comprising a dielectric layer between the gate of the at least one image sensing pixel and the first substrate, wherein the dielectric layer has a thickness between about 10 nm and about 100 nm.

Example 9 includes the image sensor of any one of Examples 1-8, wherein the array of image sensing pixels comprises a plurality of columns of image sensing pixels, wherein each column of image sensing pixels on the first substrate is coupled to a corresponding conductive structure and each corresponding conductive structure is coupled to a corresponding readout circuit on the second substrate.

Example 10 includes the image sensor of any one of Examples 1-9, wherein the gate of each image sensing pixel comprises polysilicon.

Example 11 is an image sensor that includes a pixel array on a first substrate and having at least one column of pixels, a conductive structure coupled to at least one pixel of the column of pixels, a readout circuit coupled to the conductive structure and on a second substrate different from the first substrate, a column amplifier coupled to the readout circuit, an analog-to-digital converter (ADC) coupled to the column amplifier, and a processor coupled to the ADC. The at least one column of pixels includes at least a first pixel having a first gate over a semiconductor layer and a second pixel having a second gate over the semiconductor layer. The first gate partially overlaps with the second gate.

Example 12 includes the image sensor of Example 11, further comprising one or more reset gates coupled to any of the image sensing pixels.

Example 13 includes the image sensor of Example 12, wherein the one or more reset gates are on the first substrate.

Example 14 includes the image sensor of any one of Examples 11-13, wherein the conductive structure comprises a first conductive pad on the first substrate and a second conductive pad on the second substrate.

Example 15 includes the image sensor of any one of Examples 11-14, wherein the conductive structure has a cross-sectional area of less than 1 $\mu m^2$.

Example 16 includes the image sensor of any one of Examples 11-15, wherein the first gate, the second gate, and the semiconductor layer are doped with n-type dopants.

Example 17 includes the image sensor of any one of Examples 11-16, wherein an overlap gap between the first gate and the second gate is between about 10 nm and about 100 nm.

Example 18 includes the image sensor of any one of Examples 11-17, further comprising a dielectric layer between the first gate and the semiconductor layer and between the second gate and the semiconductor layer, wherein the dielectric layer has a thickness between about 10 nm and about 100 nm.

Example 19 is an image sensor that includes a first substrate having an array of image sensing pixels, a second substrate having a readout circuit that comprises one or more metal oxide semiconductor (MOS) devices, and a conductive structure that contacts at least a portion of the first substrate and at least a portion of the second substrate. The array of image sensing pixels comprises a first pixel having a first gate and an adjacent second pixel having a second gate where the first gate partially overlaps with the second gate. The conductive contact is coupled to an image sensing pixel of the array of image sensing pixels and is coupled to the readout circuit.

Example 20 includes the image sensor of Example 19, further comprising one or more reset gates coupled to any of the image sensing pixels.

Example 21 includes the image sensor of Example 20, wherein the one or more reset gates are on the first substrate.

Example 22 includes the image sensor of any one of Examples 19-21, wherein the conductive structure comprises a first conductive pad on the first substrate and a second conductive pad on the second substrate.

Example 23 includes the image sensor of any one of Examples 19-22, wherein the conductive structure has a cross-sectional area of less than 1 $\mu m^2$.

Example 24 includes the image sensor of any one of Examples 19-23, wherein the first gate and the second gate are doped with n-type dopants.

Example 25 includes the image sensor of any one of Examples 19-24, wherein an overlap gap between the first gate and the second gate is between about 10 nm and about 100 nm.

Example 26 includes the image sensor of any one of Examples 19-25, wherein the first gate and the second gate are both over a common semiconductor layer.

Example 27 includes the image sensor of Example 26, further comprising a dielectric layer between the first gate and the common semiconductor layer and between the second gate and the common semiconductor layer, wherein the dielectric layer has a thickness between about 10 nm and about 100 nm.

Example 28 includes the image sensor of any one of Examples 19-27, wherein the array of image sensing pixels comprises a plurality of columns of image sensing pixels, wherein each column of image sensing pixels on the first substrate is coupled to a corresponding conductive structure and each corresponding conductive structure is coupled to a corresponding readout circuit on the second substrate.

Example 29 includes the image sensor of any one of Examples 19-28, wherein the first substrate does not include any MOS devices.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

What is claimed is:

1. An image sensor, comprising:
    an array of image sensing pixels on a first substrate, wherein at least one image sensing pixel comprises a gate over the first substrate, and wherein an adjacent gate from an adjacent image sensing pixel partially overlaps with the gate of the at least one image sensing pixel;
    a conductive structure on the first substrate and coupled to a given pixel of the array of image sensing pixels;
    a readout circuit coupled to the conductive structure, wherein the readout circuit comprises one or more metal oxide semiconductor (MOS) devices on a second substrate different from the first substrate; and
    a dielectric layer between the gate of the at least one image sensing pixel and the first substrate, wherein the dielectric layer has a thickness between about 10 nm and about 100 nm.

2. The image sensor of claim 1, further comprising one or more reset gates coupled to at least one of the image sensing pixels.

3. The image sensor of claim 1, wherein the conductive structure comprises a first conductive pad on the first substrate and a second conductive pad on the second substrate.

4. The image sensor of claim 1, wherein the conductive structure has a cross-sectional area of less than 1 $\mu m^2$.

5. The image sensor of claim 1, wherein an overlap gap between the gate of the at least one image sensing pixel and the adjacent gate of the adjacent image sensing pixel is between about 10 nm and about 100 nm.

6. The image sensor of claim 1, wherein the array of image sensing pixels comprises a plurality of columns of image sensing pixels, wherein each column of image sensing pixels on the first substrate is coupled to a corresponding conductive structure and each corresponding conductive structure is coupled to a corresponding readout circuit on the second substrate.

7. An image sensor, comprising:
    a pixel array on a first substrate and having at least one column of image sensing pixels, wherein the at least one column of pixels includes at least a first pixel having a first gate over a semiconductor layer and a second pixel having a second gate over the semiconductor layer, wherein the first gate partially overlaps with the second gate;
    a conductive structure coupled to at least one pixel of the column of pixels;
    a readout circuit coupled to the conductive structure and on a second substrate different from the first substrate;
    a column amplifier coupled to the readout circuit;
    a dielectric layer between the first gate and the semiconductor layer and between the second gate and the semiconductor layer, wherein the dielectric layer has a thickness between about 10 nm and about 100 nm;

an analog-to-digital converter (ADC) coupled to the column amplifier; and
a processor coupled to the ADC.

8. The image sensor of claim 7, further comprising one or more reset gates coupled to at least one of the image sensing pixels.

9. The image sensor of claim 7, wherein the conductive structure comprises a first conductive pad on the first substrate and a second conductive pad on the second substrate.

10. The image sensor of claim 7, wherein the first gate, the second gate, and the semiconductor layer are doped with n-type dopants.

11. The image sensor of claim 7, wherein an overlap gap between the first gate and the second gate is between about 10 nm and about 100 nm.

12. An image sensor, comprising:
a first substrate having an array of image sensing pixels, wherein the array of image sensing pixels comprises a first pixel having a first gate and an adjacent second pixel having a second gate, and wherein the first gate partially overlaps with the second gate, wherein the first gate and the second gate are both over a common semiconductor layer;
a second substrate having a readout circuit that comprises one or more metal oxide semiconductor (MOS) devices;
a conductive structure that contacts at least a portion of the first substrate and at least a portion of the second substrate, wherein the conductive contact is coupled to an image sensing pixel of the array of image sensing pixels and is coupled to the readout circuit; and
a dielectric layer between the first gate and the common semiconductor layer and between the second gate and the common semiconductor layer, wherein the dielectric layer has a thickness between about 10 nm and about 100 nm.

13. The image sensor of claim 12, wherein the conductive structure comprises a first conductive pad on the first substrate and a second conductive pad on the second substrate.

14. The image sensor of claim 12, wherein the conductive structure has a cross-sectional area of less than 1 $\mu m^2$.

15. The image sensor of claim 12, wherein an overlap gap between the first gate and the second gate is between about 10 nm and about 100 nm.

16. The image sensor of claim 12, wherein the array of image sensing pixels comprises a plurality of columns of image sensing pixels, wherein each column of image sensing pixels on the first substrate is coupled to a corresponding conductive structure and each corresponding conductive structure is coupled to a corresponding readout circuit on the second substrate.

* * * * *